United States Patent [19]
Knudsen et al.

[11] Patent Number: 5,322,976
[45] Date of Patent: * Jun. 21, 1994

[54] PROCESS FOR FORMING POLYIMIDE-METAL LAMINATES

[75] Inventors: Philip D. Knudsen, Northborough; Daniel P. Walsh, Peabody, both of Mass.

[73] Assignee: Polyonics Corporation, Newburyport, Mass.

[*] Notice: The portion of the term of this patent subsequent to Feb. 16, 2005 has been disclaimed.

[21] Appl. No.: 793,611

[22] Filed: Nov. 18, 1991

Related U.S. Application Data

[60] Division of Ser. No. 464,230, Jan. 12, 1990, Pat. No. 5,066,545, which is a continuation-in-part of Ser. No. 268,246, Oct. 3, 1988, Pat. No. 4,894,124, which is a division of Ser. No. 155,897, Feb. 16, 1988, Pat. No. 4,868,071, which is a continuation-in-part of Ser. No. 18,346, Feb. 24, 1987, Pat. No. 4,725,504, and a continuation-in-part of Ser. No. 18,342, Feb. 24, 1987, Pat. No. 4,806,395.

[51] Int. Cl.⁵ ............................................. H05K 1/00
[52] U.S. Cl. ................................. 174/262; 174/255; 174/257
[58] Field of Search ............... 174/255, 257, 262, 263, 174/264, 265, 266

[56] References Cited

U.S. PATENT DOCUMENTS 3,760,091 9/1973 Cannizzaro et al. .
4,464,704 8/1984 Huie et al. .
4,682,270 7/1987 Whitehead et al. .
5,066,545 11/1991 Walsh .

Primary Examiner—Leo P. Picard
Assistant Examiner—Cheryl R. Figlin
Attorney, Agent, or Firm—Paul J. Cook

[57] ABSTRACT

Polyetherimide-metal laminates are formed by etching the surfaces of a polyetherimide web with a glycol-containing etchant followed by electroless nickel or cobalt deposition and then by copper deposition. The glycol-containing etchant can be utilized to form through holes through the web.

3 Claims, 2 Drawing Sheets

PROCESS FOR FORMING POLYIMIDE-METAL LAMINATES

REFERENCE TO RELATED APPLICATIONS

This is a divisional of co-pending application Ser. No. 464,230 filed on Jan. 12, 1990, now U.S. Pat. No. 5,066,545, which is a continuation-in-part of application Ser. No. 268,246, filed Oct. 3, 1988, now U.S. Pat. No. 4,894,124, which in turn is a divisional of application Ser. No. 155,897, filed Feb. 16, 1988, now U.S. Pat. No. 4,868,071 which in turn is a continuation-in-part of application Ser. Nos. 018,346, filed Feb. 24, 1987, now U.S. Pat. No. 4,725,504 and U.S. Ser. No. 018,342, filed Feb. 24, 1987, now U.S. Pat. No. 4,806,395.

BACKGROUND OF THE INVENTION

This invention relates to a process for texturing one or both surfaces of a polyimide sheet to form the base layer for metal laminates and to a process for coating one or both surfaces of the textured polyimide sheet with electrolessly deposited nickel or cobalt and then with electrolytic copper. This invention also relates to a process for forming holes through a polyimide sheet and to a process for coating the walls of the holes with electroless nickel or cobalt and then with electrolytic copper.

Certain electronic assemblies have conductor traces on both sides of a dielectric substrate. Preferred dielectrics for applications requiring flexible substrates, especially in multilayer constructions, involve the use of polyimide films. In general practice the conductive layers on this substrate are provided through the use of metal foils and adhesives specially formulated for their physical and thermal stability. The conductive layers are also provided in some cases through direct metalization by sputtering or by electroless deposition involving methods well known to those versed in the art.

Currently the only commercially available polyimide laminate materials produced in the absence of an adhesive, suitable for IPC Class 3 electronic circuit applications are produced by processes set forth in the related applications and patents referred to above. The adhesive bonding method has certain disadvantages especially in critical service and multilayer applications, where either properties of the adhesive or the physical space occupied by the adhesive are limiting factors. For example, these adhesive-bonded laminate materials exhibit poor dimensional stability, a severe disadvantage for laying up multilayer boards. The preferred construction (especially in multilayer applications) would avoid the use of adhesives and provide the metal directly bonded to the substrate except for the laminate product described and claimed in the above-identified copending applications and U.S. Pat. Nos. 4,725,504 and 4,868,071.

Two present methods for preparing polyimide adhesiveless metal coated laminates are the related methods of vacuum and sputter deposition, followed by electrolytic copper buildup to desired thicknesses. Sputtering provides better adhesion than vapor deposition but neither technique provides physical properties adequate for critical service applications. Several commercially available single-sided materials are produced by these methods. The adhesion values obtained on subsequent copper buildup to greater than 25 μm are very low for materials with sputtered copper. One structure has an initial chromium layer sputtered to the polyimide film which is then covered with a sputtered layer of copper. A disadvantage of this construction is that chromium is not removed easily during subtractive processing of electronic traces using standard etchants designed to remove copper.

An alternative method for preparing a polyimide adhesiveless metal clad laminate is to cast a liquid solution of a polyimic acid onto the surface of a metal foil, and to heat the entire composition to a temperature which will imidize the polyamic acid and form a polyimide or amide modified polyimide film. Several modifications of this basic technique are disclosed in U.S. Pat. Nos. 3,682,960; 3,781,596; 3,981,691; 4,148,969; and 4,496,794. At present, laminates produced by this technique have limited application areas due to their poor dimensional stability. This method is also limited by the availability of suitable thin metal foils.

In order to provide an adherent metal layer or layers to a polyimide film substrate by chemical metal deposition, several basic procedures are employed. Since processing is done in aqueous solutions, the surface of the polyimide film must be rendered hydrophilic to facilitate uniform adsorption of the catalyst used for seeding the electroless metal deposition. Commonly referred to as etching, this treatment also serves to microetch the surface of the polyimide, thus providing a mechanical interlock between the polyimide and metal layer. This surface preparative step will be referred to herein as texturing for purposes of this application to avoid confusion with the removal of unwanted metal during circuit preparation which also is referred to as etching in the printed circuit industry.

U.S. Pat. Nos. 3,791,848 and 3,821,016 to DeAngelo disclose an aqueous ethylenediamine basic composition wherein the diamine is present in an amount in excess of its degree of solubility, thereby forming a two-phase system. The preferred aqueous basic compounds are disclosed as the hydroxides of the alkali metals including sodium, potassium, lithium, rubidium, and cesium. The examples are specifically directed to texturing with sodium hydroxide in very strong solution containing the ethylenediamine in suspension so as to yield a pitted surface on the polyimide. Since a two-phase system is utilized, the polyimide surface tends to be non-uniformly and incompletely textured. The degree of texturing for a given portion of the surface depends upon which phase of the solution to which a portion of the surface is primarily exposed. These non-uniformities result in subsequent non-uniform deposition of catalyst and electroless metal and in a rough irregular appearance of the final metal coated film.

U.S. Pat. No. 3,767,538 to Politycki et al describes an attempt to produce a well-adherent double-sided laminate on polyimide film. The film surface is roughened by a fresh mixture of sulfuric and hydrochloric acids or by mechanical impingement of sand on the surface and, if needed, a further sodium hydroxide treatment may be employed. The polyimide film is then heated to expel water and then seeded for metalization in a colloidal palladium bath. After this, an electrically conductive, water-vapor permeable continuous layer of silver is deposited by electroless deposition and the film is heated at 150° C. to expel water. Finally, a layer of copper is electrolytically deposited to form the laminate structure. No specific adhesion values are reported for the laminate produced by this method.

A high speed additive circuit process on a polyimide substrate using electroless nickel for metalization (no etching of metal required) is described in U.S. Pat. No. 3,573,973 to Drotar et al. The basic process steps are: preparing the substrate, catalyzing, printing a mask, heat setting of the masking ink, electroless plating of a nickel/phosphorous alloy, heating at 195° C. to improve metal to polyimide bond and then either electrolytic plating solder coating to decrease the electrical resistance of the resultant structure. The use of a nickel/phosphorous alloy as the metalizing layer may cause difficulty etching laminates produced by this method during subtractive circuit production methods. The adhesion values reported are 5.0 lb./in. maximum by a nonstandard test and there is no mention of the stability of the product to solder float or thermal cycling stress. The low adhesion of metal to polyimide limits the use of these laminates. The method of Drotar, therefore, does not provide a method for preparation of metal coated laminates for general use in the printed circuit industry.

It is to be understood that adhesion strength of metal to polyimide as measured by standard peel strength testing depends upon the specific polyimide utilized as the substrate in the laminate. For polyimides having relatively low tensile modules, peel strengths will be higher as compared to polyimides having a relatively higher tensile modules such as Upilex or Ultem films. In any event, for a given polyimide film failure, as a result of a peel strength test should occur within the polyimide film in preference to failure at the polyimide-metal interface since this shows that the adhesive bond between the metal and the polyimide exceeds the cohesive strength within the polyimide film.

In U.S. Pat. No. 3,954,570 to Shirk et al, another additive method is disclosed wherein the electroless deposit may be nickel. The authors cite no advantage of one metal over another in the initial metalizing step, and specifically claim a patterned flame sensitized surface which is catalyzed, preferably with tin and palladium, then electroless plated with either copper, nickel, or cobalt. The method of Shirk et al also provides low bond strengths, and for the non-standard solder dip test disclosed, no advantage is stated for the use of electroless nickel rather than electroless copper or cobalt.

Another additive method for circuit preparation on a polyimide substrate is disclosed in U.S. Pat. No. 4,078,096 to Redmond et al. The method described is for texturing the surface of the polymer with a hydrazine/caustic solution, catalyzing, then plating with either electroless nickel, copper or cobalt. The method relates to the preparation of a specific circuit type by an additive process, and the maximum initial peel strength disclosed is only 4.6 lb./in. which is too low for general use in the printed circuit industry. Samples made by the method of this patent result in cohesive failure of the polyimide film at bond values of only 4.0 lb./in. using the optimum formulation of 60 percent hydrazine hydrate and 9.3 percent sodium hydroxide disclosed by Redmond in Table II. This lowering of the cohesive strength of the film is alluded to by Redmond in Column 4, lines 37–40, where the failure mode of well adhered and poorly adhered samples is discussed. Cohesive failure at such low values indicates degradation of the polymer film which is seen as ripping in the z-axis during peel testing. There is no disclosure of completely coating one or both surfaces of a polyimide sheet with electrolessly deposited metal followed by electrolytically deposited metal.

There have been prior attempts to provide an adherent metal layer on both sides of polyimide sheets by direct metalization using electroless copper followed by electrolytic copper buildup to the desired thickness. This technique has proven unsuitable in practice since blistering of the electroless copper layer usually occurs when simultaneously applied to both sides of the film. If blistering is avoided, the peel strength of the resultant laminate is less than that for a single-sided laminate of the same metal thickness.

Perrins, in *Transactions of the Institute of Metal Finishing* (1972) Volume 50, pp. 38–45, discloses a process for electroplating propylene polymers with electroless nickel or copper followed by electrolytic plating with copper. The plating in this case in conducted on only one side of propylene copolymer plaques. The use of the nickel provides improved adhesion especially after thermal cycling of the sample which will cause degradation of the copper/polymer bond. This process, where nickel is used as the base metal layer, has only been applied to injection molded or bulk processed polymers, but has not been extended for use on thin film substrates. Therefore, the nickel process has been restricted to use where the nickel layer is never removed but remains a permanent part of the finished article.

In "Applications of Additive Circuitry", a technical paper presented at the Institute of Printed Circuits in September, 1974, Brewer discloses a method in which nickel is deposited on both surfaces of a paper reinforced phenolic. Electroless copper is then deposited and the plated panel is heated beyond the glass transition temperature of the substrate material to improve the nickel to polymer adhesion. This method is not applicable to non-thermoplastic substrates such as polyimide films.

*In Plating and Surface Finishing*, "Interfacial Bonding of Nickel to Polyamide-Imide", Vol. 66, No. 6, (June, 1979) pp. 68–71, Levey et al, describes nickel plating on a rigid polyamide-imide substrate textured with an abrasive and/or sodium or potassium hydroxide. The article relates the effect of various surface treatments on metal adhesion, and specifically to the combination of mechanical abrasion followed by a chemical treatment such as dipping in aqueous alkali metal hydroxide solutions. The article states that no advantage was observed with the use of nickel rather than copper for the initial metalization of the polymer, and concludes that the adhesion of the metal to the polyamideimide substrate is a combination of both mechanical and chemical factors related to the substrate.

An additional polyimide treating process involving the use of a texturizing compound having a nitrogen-oxygen moiety is disclosed in U.S. Pat. 4,775,449.

Except for the laminate product described and claimed in U.S. Pat. Nos. 4,725,504 and 4,868,071 prior to the present invention, there has been no commercially viable method available for the direct coating of polyimide films with electrically conductive layers, without the use of an adhesive exhibiting adequate properties for general use in electronic circuitry. Adhesiveless laminates with metal on both sides have not been available due to the tendency for an electroless metal layer to blister during deposition onto both sides of a thin film, and to the destruction of polyimide to metal adhesion by thermal shock upon immersion in molten solder or because of undesirable reduction of film strength due to texturing. The problem of electroless metal blistering is especially acute in the complete metalization of thin polymeric film; hydrogen evolution during the deposition process has been suggested as a cause of electroless metal blistering. Electroless metal blistering on thin polymeric substrates is greatly reduced when the metal deposition is restricted to certain areas on the film (i.e., other than complete surface coverage).

In U.S. Pat. Nos. 4,725,504 and 4,868,071 processes are disclosed for forming polyimide film coated on both surfaces with electroless nickel or cobalt followed by electrolytic copper coated on the nickel or cobal which is useful for forming printed circuits. In U.S. Pat. No. 4,806,395 there is described a process for uniformly and substantially completely texturing the surface(s) of a polyimide film with a one-phase solution of an amine of the formula $H_2N(CH_2)_nNH_2$ where n is an integer from 2 to 6, an alkali metal hydroxide and a water miscible monohydric alcohol.

It would be desirable to provide a process for coating at least one surface of a polyimide film having an exposed copper surface and having sufficient adherent strength to the polyimide and sufficient resistance to thermal shock to render the resultant laminate useful for fabricating electronic circuits. In addition, it would be desirable to provide such a process which also permits the formation of through holes, the walls of which can be coated to form on exposed copper surface in order to provide electrical connection of circuits on both surfaces of the polyimide film.

SUMMARY OF THE INVENTION

The present invention is directed to a process whereby the surface of a polyimide film is hydrophilized with a one-phase texturing composition comprising a glycol, an alkali metal hydroxide and an alkylene diamine. As used herein, the term "polyimide" includes polyimides and polyetherimides. The texturant solution provides a textured and hydrophilic surface, and the mechanical bulk properties of the film are substantially unaffected. When the polyimide contains a filler, the surface is substantially and completely textured. This surface of the textured film is characterized by nodules or bumps, rather than pits as reported for other texturing methods. When viewed through a microscope the completeness of surface texturing is readily seen as disclosed in U.S. Pat. Nos. 4,725,504 and 4,806,395 which are incorporated herein by reference. When the polyimide sheet is unfilled, the hydrophilized surface is smooth.

The treated polyimide film is uniformly coated on one or both surfaces with a strongly adherent electroless nickel or cobalt layer followed by an electrolytic copper layer. Adherent layers of exposed copper are electrolytically plated on one or both sides of the sheet and metal layers of controlled thickness are produced which provide laminates useful for the production of electronic circuitry. When producing a two sided metal coated laminate resistant to multiple thermal shocks, the polyimide film coated with nickel or cobalt or including a thin copper coating on the nickel or cobalt coating is mechanically worked to form microcracks in metal coatings thereby exposing a portion of the polyimide surface. The mechanically worked laminate then is heated to volatilize any volatilizable components, such as moisture in the laminate. The resultant laminate then is coated with electrolytic copper on both surfaces to the desired copper thickness. This microcracking process is disclosed in U.S. Pat. No. 4,868,071 which is incorporated herein by references. These laminate structures are suitable for general use in the production of electronic circuitry. The terms "web", "sheet" and "film" are used herein interchangeably and refer to thin flat polymer substrates.

The one phase texturant solution of this invention can be heated to a temperature between about 30° C. and the boiling point of the solution, generally up to about 80° C., for utilization in conjunction with a mask to form holes through the sheet in a desired configuration. It has been found that the texturant solution of this invention is extremely effective for forming through-holes in any desired pattern through polyimide sheets.

The hydrophilized surface of the film is receptive to colloidal catalyzation and the subsequent electroless deposition of an electrically conductive nickel or cobalt layer, yet the original mechanical bulk properties of the film are substantially unaffected. The hydrophilized surface of the polyimide film including hole walls are contacted with colloidal palladium in order to provide a catalytic surface for the deposition of electroless nickel or cobalt. Nickel or cobalt is then deposited on the receptive surfaces by electroless deposition to form a layer permeable to hydrogen gas and water permeable layer which is electrically conductive. As used herein, the term "nickel", as it relates to the initial metal layer, includes nickel metal or a nickel containing alloy. Also as used herein, the term "cobalt", as it relates to the initial metal layer includes cobalt metal or a cobalt containing alloy. This textured film can also be useful as a substrate for the fabrication of adhesive-based metal clad laminates, if desired.

In accordance with this invention, laminate constructions are provided which are coated on one surface with electroless deposited nickel or cobalt and copper, the second surface being either bare polyimide (FIG. 1) or coated with electroless nickel or cobalt (FIG. 2). When Kapton, PMDA-ODA or Apical AV type polyimide films are tested according to IPC test 2.4.9 (July 1985 update), these laminates are characterized by peel strengths of at least 6.0 lb./in. by Method C. These laminates also pass IPC test 2.4.13 (December 1982 update). All test methods referred to herein are from IPC TM 650, and are performed using laminates that have been coated with metal to a standard thickness of 35 um. These are test methods normally used by circuit manufacturers to determine laminate material quality. When the electroless nickel or cobalt thickness is greater than about 1.0 um with either of these two constructions, adhesion values of at least 5.0 lb./in. and usually greater than 6.0 lb./in. can be obtained with IPC test 2.4.9. Method C. The double-sided construction passes a modification of IPC test 2.4.13 where metal remains on both sides of the sample. When higher tensile module polyimides such as UPILEX-S type or ULTEM type films are tested, the measured peel strengths are lower. However, failure as a result of the peel strength tests occur within the polyimide sheet rather than at the metal-polyimide interface which shows that failure is a result of cohesive strength failure within the film rather than adhesive strength failure at the metal-film interface. The laminates of this invention also are capable of passing a modification of IPC test 2.4.9 Method E for determining laminate strength after thermal cycling. Prior to this present invention, no adhesiveless double-sided laminate, other than that disclosed in U.S. Pat. No. 4,868,071 is capable of passing this thermal test.

In another aspect of this invention, a laminate construction is provided which is coated on both surfaces with electroless nickel or cobalt and electrolytic copper (FIG. 3), which may of may not contain through holes.

DESCRIPTION OF THE SPECIFIC EMBODIMENTS

Figure 1:
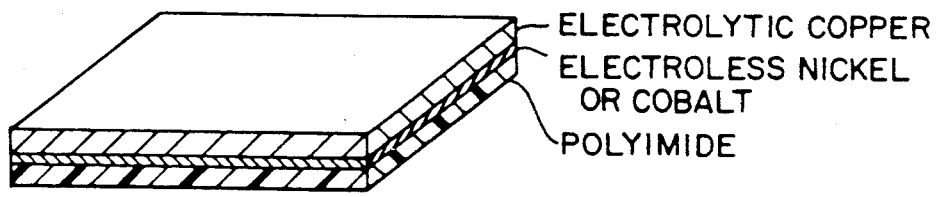
FIG. 1 shows the embodiment of this invention coated on one side with nickel or cobalt and copper.
Figure 2:
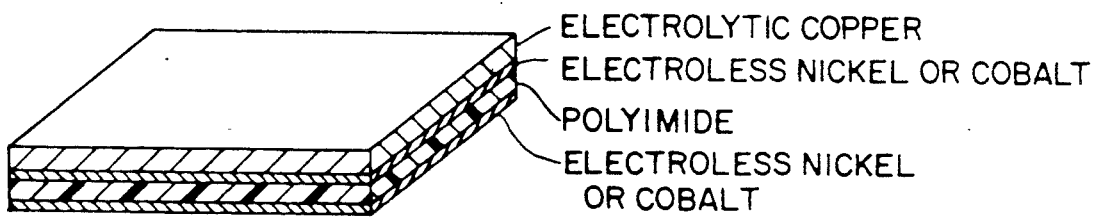
FIG. 2 shows the embodiment of this invention coated on both sides with nickel or cobalt and on only one side with copper.
Figure 3:
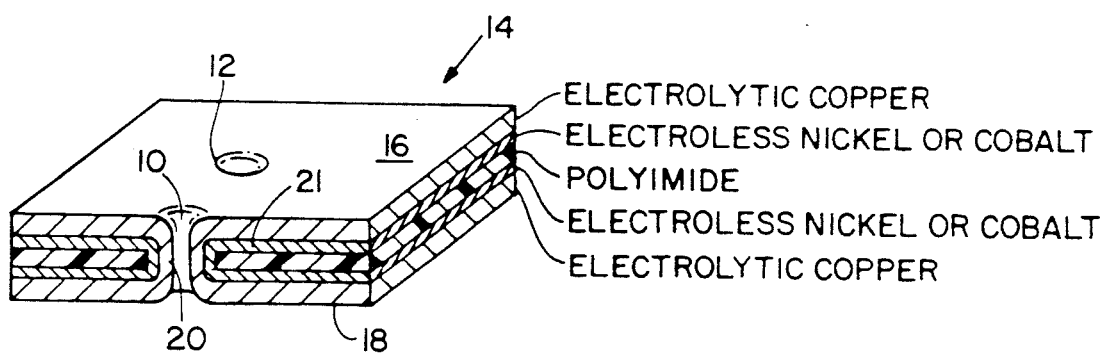
FIG. 3 shows the embodiment of this invention coated on both sides with nickel or cobalt and copper and which contains through holes coated with nickel or cobalt and then with copper.
Figure 4:
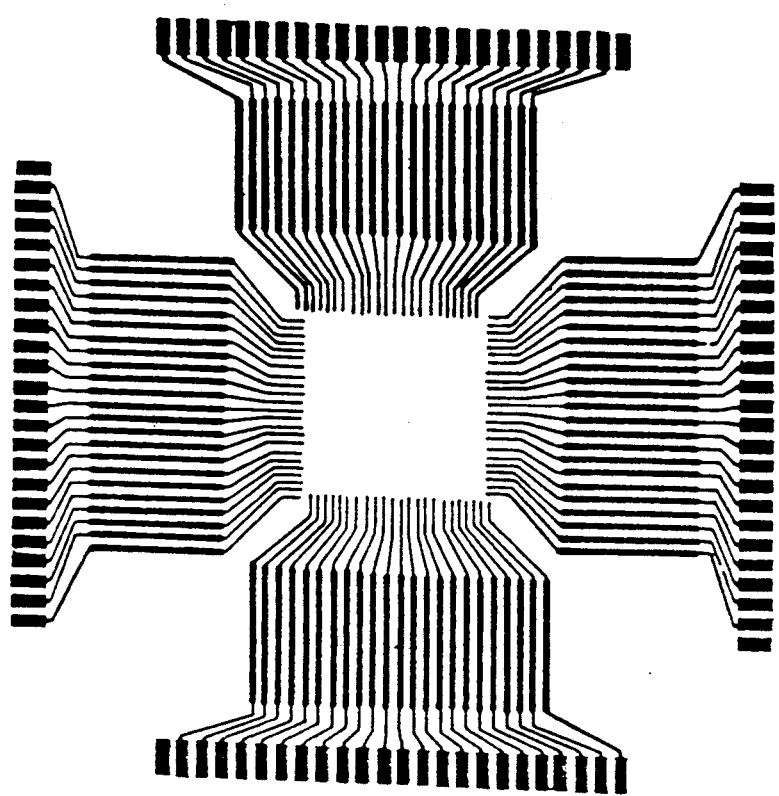
FIG. 4 shows a typical Tape Automated Bonded circuit produceable by the process of this invention.

Referring to FIG. 3, the laminated product of this invention can include at least one through-hole 10 and optionally an additional through-hole 12 each of which extend through the entire thickness of the laminate 14 so that the copper surfaces 16 and 18 are electrically connected by copper coating 20 as well as nickel or cobalt coating 21 on the surfaces of the through-holes 10 and 12.

In the preferred embodiment of this invention, the polyimide surfaces treated are of the type prepared from a polyamide-acid (also referred to as polyamic acid) which has the formula:

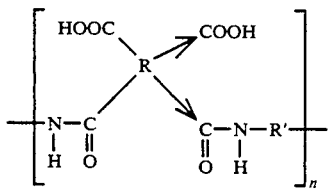

where the arrows denote isomerism, R is an organic tetravalent radical containing at least two carbon atoms, no more than two carbonyl groups of each polyamic acid unit being attached to any one carbon atom of said tetravalent radical; R' is a divalent radical containing at least two carbon atoms, the amide groups of adjacent polyamide-acid units attached to separate carbon atoms of divalent radical and n is a positive interger sufficient to provide the polyamic acid with an inherent viscosity of at least 0.1. Preferred polyimides included Kapton (Trademark registered to DuPont) which is the polyimide formed from pyromellitic anhydride,

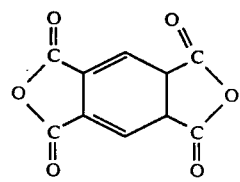

and 4,4'-diamino-diphenyl ether,

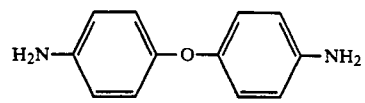

and having the general formula:

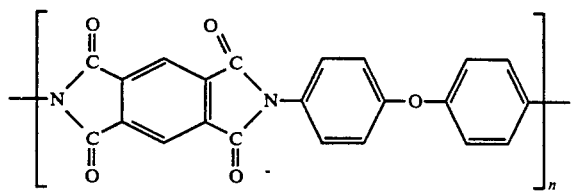

where n is an integer ranging from 150 to 650 and which have an average molecular weight of 60,000 to 250,000. The above polyimides and their preparation are described in U.S. Pat. Nos. 3,179,614 and 3,179,634 to Edwards, which are incorporated herein by reference. Other preferred polyimides are sold under the tradename, Apical by Allied Signal Corporation and made by Kanegafuchi Corporation of Japan and Upilex by I.C.I. America, Inc. and made by UBE Industries, Inc. of Japan and the polyetherimide sold by General Electric Company under the tradename Ultem.

The polyimide can have any thickness suitable as a substrate for electronic circuitry, and most generally is in the form of a relatively thin sheet having a thickness of between about 12 and 125 um. Prior to this invention, a polyimide film coated on both sides with a permanently bonded metal comprising electroless nickel or cobalt followed by electrolytic copper capable of passing current IPC tests in particular IPC tests 2.4.9 and 2.4.13, for adhesion, thermal shock or stability against thermal cycling has not been achieved without the use of a separate adhesive layer.

Tests for thermal cycling are designed to test the resistance against delamination of the laminate product of this invention under the conditions of alternating (a) high temperature and pressure and (b) room temperature. The modification of IPC test 2.4.9, Method E, described herein is intended to simulate conditions that would be experienced by the laminate material during the manufacture of a typical multilayer circuit product, wherein the laminate of this invention would make up one or more of the multiple circuit layers. The actual test used is as follows:

A sample of the laminate of this invention is masked and etched to produce ⅛th inch wide lines of copper plated on the electroless nickel or cobalt. A sample of the etched laminate to be tested is placed in a cold laminating press between two sheets of Kraft paper, and held flat with two steel platens also referred to as caul plates in the industry. The platens are pressurized to 350 PSI, the temperature is raised to 350° F. and once the high temperature is attained, the sample is held at that temperature and pressure for one hour. The sample is then allowed to cool to room temperature, the pressure is released and the cycle is repeated twice more. Once the sample has passed through this sequence of steps it is then tested for peel strength adhesion as in IPC Test 2.4.9 Method A. Adhesion values greater than about 2.5 lbs./inch are confirmation of a useful laminate material.

The test is designed to imitate actual laminating conditions anticipated during circuit manufacture. This test will be referred to in the specification and claims as "Modified Thermal Cycling IPC Test 2.4.9, Method E.

| Methods Used for Circuit Preparation | |
|---|---|
| Semi-additive Process | Subtractive Process |
| Thin Laminate (e.g., 0.5-8 um metal) | Thick Laminate (e.g., 35 um metal) |
| Resist Coat | Resist Coat |
| Photoimage | Photoimage |
| Develop resist | Develop resist |
| Electrolytic copper plate (e.g., 35 um) | Etch unmasked metal |
| Strip resist | Strip resist |
| Etch to remove thin laminate metals | |

No modification of existing procedures for the production of said circuitry is necessary using laminates of this invention. A further advantage for the use of the method of this invention is that metal thicknesses can be provided easily from extremely thin to very thick layers. Laminates with layers of metal less than about 18 um (½ ounce) are difficult to produce using present adhesive laminate production methods, but are easily produced in a continuous roll-to-roll process by the method of this invention.

The polyimide film surface should be relatively clean, but a cleaning or degreasing step may be performed (if necessary) prior to contact with a suitable texturant. The texturant of this invention renders the surface hydrophilic and provides a uniformly and completely frosted or matte appearance to the surface of a film contains a filler which is due to nodules remaining when surrounding material is selectively dissolved by the texturant. The one-phase texturing composition is comprised of an alkali hydroxide, a diamine of the formula, $H_2N(CH_2)_nNH_2$ wherein n is an integer from 2 to 6, preferably ethylenediamine, an alkylene glycol of the formula $OH(CH_2)_mOH$ wherein m is an integer of 2 to 4 and the remainder water.

The alkali metal hydroxide can comprise potassium hydroxide, sodium hydroxide, lithium hydroxide or mixtures thereof with potassium hydroxide being preferred. The concentration of hydroxide is between about 25 and 50 percent by weight and preferably between about 30 and 40 percent by weight. The concentration of the diamine compound in the texturing solution is sufficient to effect the desired surface modification without forming a two-phase liquid composition and is between about 5 and 20 percent by weight, preferably between about 8 and 12 percent by weight. The concentration of the glycol compound in the texturing solution is sufficient to effect the desired surface modification without forming a two-phase liquid composition and is between about 5 and 20 percent by weight, preferably between 8 and 12 percent by weight. The particular percentage of each component in the texturant is adjusted according to the content of the alkali hydroxide or diamine in order to maintain a one-phase system at the temperature used for texturing the film. The one phase system permits obtaining uniform surface hydrophilization.

In one aspect of this invention, the texturant is heated to a temperature above about 30° C. up to a temperature where substantial evaporation begins, i.e., about 80° C. and, in conjunction with a mask is utilized to form holes through the polyimide sheet. The walls of the holes are then treated as described below to be coated with a nickel or cobalt layer followed by a copper layer so that an electrically conducting path is formed between circuits on both surfaces of the polyimide sheet.

Once the clean polyimide surface has been treated to render the surface textured and hydrophilic, the film is catalyzed with any one of the catalyst systems well known to those versed in the art of electroless plating. Catalyst combinations which can be used in conjunction with the sensitized polyimide surface are disclosed in U.S. Pat. Nos. 3,011,920 and 3,562,038 which are incorporated herein by reference. The catalyst may be applied in a two step application, by first depositing the sensitizer and then the noble metal activator; however, these baths may be combined in a one step operation, e.g., a black colored tin-palladium colloidal dispersion. The catalyzing is provided for a period of one to five minutes, and then the sample is immersed in an acidic solution to remove tin from the surface in a process referred to as acceleration. The sample is then placed in an electroless nickel or cobalt bath for a period ranging from about two to ten minutes to provide the desired thickness of nickel.

Suitable electroless nickel baths are disclosed in U.S. Pat. Nos. 3,062,666; 3,140,188; 3,338,726; 3,531,301; 3,537,878; and 3,562,038 which are incorporated herein by reference. Some typical formulations are shown:

| | | |
|---|---|---|
| 1. Nickel chloride ($NiCl_2.6H_2O$) | 20.0 g/l | |
| Sodium hypophosphite ($NaH_2PO_2.H_2O$) | 60.0 g/l | |
| Ammonum oxalate (($NH_4)_2C_2O_4.H_2O$) | 40.0 g/l | |
| Ammonium Hydroxide 25% pH 8.2, 85° C. | 60. ml/l | |
| 2. Nickel Sulphate ($NiSO_4.6H_2O$) | 20.0 g/l | |
| Dimethylamine Borane | 3.0 g/l | |
| Citric Acid | 10.0 g/l | |
| Conc. HCl pH 5.2-5.5, 95° C. | 25.0 ml/l | |
| Ammonium Hydroxide | to pH 7.0 | |
| 2-Mercaptobenzothiazole 65° C. | 0.5-2.0 mg/l | |
| 3. Nickel Sulfate ($NiSO_4;6H_2O$) | 17.1 g/l | |
| Sodium Hypophosphite ($NaH_2PO_2.H_2O$) | 14.0 g/l | |
| Acetic Acid 80% | 12.0 g/l | |
| $MoO_3$ 85% (adust to control rate) pH 5.2-5.5, 95° C. | 5.0 mg/l | |
| 4. Nickel Chloride ($NiCl_2.6H_2O$) | 16.0 g/l | |
| Dimethylamine Borane | 3.0 g/l | |
| Sodium Citrate | 18.0 g/l | |
| Glycine | 8.0 g/l | |
| Bismuth Nitrate | 20.0 mg/l | |
| Thiourea pH 7.0, 65° C. | 15.0 mg/l | |

Nickel or cobalt is deposited on the receptive surfaces by electroless deposition to form a metal coated surface. Nickel ions are reduced in this process onto the catalytic surface to form a continuous electrically conductive layer. The electroless layer must be sufficiently thick to permit the subsequent electrolytic deposition of a uniform copper layer. Generally, the electroless nickel or cobalt layer is between about 0.25 um and 1.0 um thick but can be thicker if desired. No substantial advantages are obtained with nickel or cobalt coatings greater than about 1.0 um.

The use of nickel or cobalt rather than copper as an initial metal layer provides several significant advantages. In the electroless deposition of metal, a certain amount of hydrogen gas is liberated as part of the reaction. Hydrogen gas is generally considered a cause of blistering during electroless copper deposition on polyimide and blistering has been a problem associated with production of a double-sided laminate on polyimide films when electroless copper is used for initial metalization. When electroless nickel or cobalt is substituted for electroless copper for direct deposition on polyimides, especially nickel or cobalt deposited from a borane reduced bath, then blistering is alleviated. It has been found that electroless nickel/boron alloys etch more easily than electroless nickel/phosphorous alloys when standard copper etchants such as cupric chloride are used. The nickel/boron alloy producing baths are easier to use with a continuous reel to reel process and are not as prone to catastrophic decomposition as are nickel/phosphorous baths. It is preferred to utilize electroless nickel baths wherein the reducer for the nickel is dimethylamine borane (DMAB), since the resultant nickel coating can be subsequently etched with a common etching solution such as copper chloride. Electroless cobalt can also be deposited from a bath formulation using DMAB as a reducer and may find use as an initial metal layer. Copper and palladium are not useful as initial metal layers since they can catalyze degradation of the polyimide and lead to poor post solder float peel strength values due to thermal sensitivity of the final laminate structure. Electrolytic copper is deposited directly on the electroless nickel or cobalt. Either in a one step or multistep process. When forming microcracks by the mechanical working procedure set forth below, a thin layer of electrolytic copper having a thickness between about 20 and 30 microinches is first deposited on the nickel or cobalt layer. After being mechanically worked and heated in the manner set forth below, electrolytic copper is then deposited on the thin electrolytic copper to the desired thickness.

While the double metal coated laminate product described and claimed in the U.S. Pat. No. 4,725,504 provides substantial advantages over prior art laminates, it is characterized by inconsistent resistance to thermal cycling. That is, the product tends to develop reduced peel strengths when exposed to repeated conditions of high temperature of the order that would be experienced by the laminate during lamination. A major use of such laminates presently is in multilayer circuits wherein the laminates in the form of double sided circuits are soldered to each other usually in a stack of three to five laminates or more. If the laminate experiences reduced peel strengths to below an acceptable minimum peel strength, it cannot be used in multilayer circuits.

In one aspect of the present invention, it has been found that, after the nickel or cobalt layers have been coated on the polyimide surface, if the resultant laminate is mechanically worked to form microcracks in the metal surfaces, following the heating, the product formed after electrolytic copper of desired thickness is formed is characterized by excellent resistance to thermal cycling in the manner described in U.S. Pat. No. 4,868,071 which is incorporated herein by reference. The microcracks can be formed into the nickel or cobalt coating either directly or after a thin layer of copper has been coated on one or both of the nickel or cobalt layers. The copper layer has a thickness such that microcracks form therein during the mechanical working. The copper layer should be less than about 50 microinches. The mechanical working step can be conducted by a variety of means including passing the laminate in contact over a dull knife edge or any other means wherein the metal surfaces of the laminate are disrupted to form microcracks in the metal coatings without delaminating the metal coating from the polyimide substrate. The microcracks extend through the entire thickness of the metal layers so that the polyimide surfaces in contact with the surfaces of the microcracks are exposed to the atmosphere. The laminate having the microcracks therein then is heated to a temperature at which volatizable components such as moisture in the polyimide layer can volatize and escape the laminate through the microcracks. The heating can be conducted in any convenient manner such as by baking in an oven or passing the laminate through a heated inert oil such as silicone, fluorocarbon, or the like. The heating is conducted at a temperature and for a time sufficient to effect substantial removal of the volatilizable materials from the polyimide sheet without degrading the polyimide layer or the metal layers. Generally, heating is effected at a temperature between about 165° C. and 225° C., preferably between about 180° C. and 210° C. for a period of about 5 to 20 minutes. The higher temperature and the longer heating time, larger amounts of volatiles are removed. In order to improve subsequent electrolytic deposition, the metal surfaces are cleaned to remove or reduce the metal oxides thereon. Copper oxide layer can be reduced with peroxysulfuric acid or other well known dilute copper etchants. The resultant laminate is then coated with copper by electrolytic deposition to the desired thickness.

A serious deficiency of prior adhesiveless laminates when compared to their adhesive-based counterparts is their failure to withstand thermal cycling. Thermal shock failure is characterized by catastrophic loss of bond strength after solder float. The laminates made from the present invention have superior performance when compared to presently available single-sided adhesiveless laminate structures.

The combination of proper polyimide film pretreatment and electroless bath chemistry, has provided an adhesiveless laminate superior to those presently available. In particular, this invention provides a laminate with the following advantages over the prior art:

1. Single or double-sided adhesiveless laminate constructions with excellent adhesion.

2. Initial adhesion values superior to those obtained using electroless copper for both single-and double-sided laminate constructions.

3. Post solder float adhesion greater than that obtained by other methods, with no random failure or blowoff during solder float testing. 4. Excellent resistance to thermal cycling effects encountered during soldering.

5. No high temperature drying need between electroless and electrolytic plating steps, thus providing more rapid processing times.

6. A superior laminate provided consistently with both sheet and roll-to-roll processing of the film.

7. Laminate structures can be provided having very thin conductive layers produced at significant cost savings, and more reliably than those produced by prior methods.

8. Laminate structures with improved flex ductility when compared to the adhesive-based and adhesiveless laminates presently available.

9. Laminate structures which have improved dimensional stability when compared to adhesive-based laminates.

10. Metal coated laminates processable under conditions normally utilized for production of circuitry when a nickel/boron alloy is used for initial metalization.

11. The process permits forming through holes in a polyimide sheet the walls of which can be coated with copper to form an electrically conducting bath between circuits on both surfaces of the sheet.

The following examples illustrate the present invention and are not intended to limit the same.

EXAMPLE I

Sixteen 3.5 inch samples of 200 VN Kapton brand polyimide film were treated either in the one phase etchent formulation 1 or 2 at 34° C.±1° C. at varying swell times with no agitation in order to render the surfaces of the polyimide hydrophilic.

| Component | Formulation 1, Wt. % | Formulation 2, Wt. % |
|---|---|---|
| H₂O | 43.3% | 71.6% |
| KOH (45% w/w) | 35.5% | 17.8% |
| Ethylene Diamine | 10.6% | 5.3% |
| Ethylene Glycol | 10.6% | 5.3% |
| | density = 1.34 g/l. | |

The amount of film milling as a function of film dwell time is shown in Table I.

TABLE I

| Dwell Time (min) | Formulation 1 | Residual Film (mil) Formulation 2 |
|---|---|---|
| 0 | 2.00 | 2.00 |
| 0.5 | 1.81 | 1.98 |
| 1.0 | 1.64 | 2.01 |
| 1.5 | 1.47 | 1.98 |
| 2.0 | 1.32 | 1.97 |
| 4.0 | 0.81 | 1.94 |
| 6.0 | 0.44 | 1.92 |
| 8.0 | 0.15 | 1.89 |
| 10.0 | 0 | 1.87 |

As shown in Table I, the Formulation 1 effected polyimide milling at a faster rate than Formulation 2.

EXAMPLE II

This example illustrates that the polyimide hydrophilized in accordance with this invention can be coated with electroless nickel and electrolytic copper to form a laminate having high peel strength.

Twenty 4 inch by 6 inch sheets of 200 vn Kapton polyimide film were immersed in the one-phase etchant solution shown in Table II for one minute with no agitation.

TABLE II

| COMPONENTS | FORMULATION, wt., % |
|---|---|
| H₂O | 43.3 |
| KOH (45% w/w) | 35.5 |
| Ethylene Diamine | 10.6 |
| Ethylene Glycol | 10.6 |

The hydrophilized film was immersed for 60 seconds at 25° C. in a 23% solution of aqueous acid bath sold under the tradename, Shipley Cataprep 404 available from Shipley Corporation. The sheets then were immersed for 2 minutes at 45° C. in a 3% concentration of an aqueous colloidal palladium catalyst sold under the tradename, Shipley Cataposit 44 available from Shipley Corporation. The sheets then were rinsed for one minute in water and then immersed for 2 minutes at 25° C. in a 10% solution of an acetic acceleration sold under the tradename, Shipley Accelerator 19 available from Shipley Corporation. The sheets then were rinsed for 30 seconds in water and then immersed for 5 minutes at 65° C. in an electroless nickel plating solution, utilizing dimethylamine borane as the reducing agent, sold under the tradename Niklad 752 from the Allied Kelite division of Witco Chemical Corporation to a final nickel thickness of about 5 um on each surface.

Ten sheets of the nickel coated laminate then were treated to form microcracks in the nickel coatings by passing the sheets over a 0.078 inch outer diameter steel cylinder. The microcracked sheets then were baked at 190° C.±5° to volatilize volatizable components from the polyimide.

The laminaters were immersed for 90 minutes at 15 amps per square food (ASF) in a brightened copper sulfate bath containing 25 ounces per gallon of sulfuric acid, 15 ounces per gallon of copper sulfate pentahydrate, 50% ppm chloride ion and ±0.0% of an organic brightener sold under the tradename, Copperlume PTH-R from M&T Chemicals, Co. to provide a laminate having a copper thickness of about 35 um. The samples then were dried.

Both the microcracked and non-microcracked samples then were tested for peel strength (lb/in) in an Instron Model 1000 Universal Testing Instrument to perform 90 degree peels using IPC test 2.4.9, Method A. The peel strength tests were constructed on ½ inch copper strips which were formed by masking with a chemically resistant tape using a copper chloride etchent solution to remove metal from unmasked areas of the sample. The results are shown in Table III.

TABLE III

| Laminate Surface | Non-Microcracked Laminate | | Microcracked Laminate | |
|---|---|---|---|---|
| | Single Coated | Double Coated | Single Coated | Double Coated |
| Side 1 | 6.7 | 4.0 | 8.0 | 7.5 |
| Side 2 | 6.9 | 4.0 | 5.1 | 5.5 |

As shown in Table III, the laminate of this invention exhibits excellent peel strengths while the non-microcracked double coated laminate, exhibited poorer peel strengths. The laminate of the invention failed within the polyimide layer rather than at the metal-polyimide interface.

EXAMPLE III

This example illustrates that the surface of a polyimide sheet can be hydrophilized in accordance with this invention and can be coated with electroless nickel and electrolytic copper to form a laminate having high peel strength.

Ten 4 inch by 6 inch prepunched sheets of 200 VN Kapton polyimide film were immersed for one minute with no agitation in the one-phase etchant solution comprising 35.5 wt. % KOH as (45% w/w), 10.6 wt % ethylenediamine, 10.6 wt. % ethylene glycol, the remaining water. The hydrophilized film was immersed for 60 seconds at 25° C. in a 23% solution of aqueous acid bath sold under the tradename, Shipley Cataprep 404 available from Shipley Corporation. The sheets then were immersed for 2 minutes at 45° C. in a 3% concentration of an aqueous colloidal palladium catalyst sold under the tradename, Shipley Cataposit 44 available from Shipley Corporation. The sheets then were rinsed for one minute in water and then immersed for 2 minutes at 25° C. in a 10% solution of an acetic acceleration sold under the tradename, Shipley Accelerator 19 available from Shipley Corporation. The sheets then were rinsed for 30 seconds in water and then immersed for 5 minutes at 65° C. in an electroless nickel plating solution, utilizing dimethylamine borane as the reducing agent, sold under the tradename Niklad 752 from the Allied Kelite division of Witco Chemical Corporation to a final nickel thickness of about 5 um on each surface.

Ten sheets of the nickel coated laminate then were treated to form microcracks in the nickel coatings by passing the sheets over a 0.078 inch outer diameter steel cylinder. The microcracked sheets then were baked at 176° C. ±1° to volatilize volatizable components from the polyimide.

The laminaters were immersed for 90 minutes at 15 amps per square food (ASF) in a brightened copper sulfate bath containing 25 ounces per gallon of sulfuric acid, 15 ounces per gallon of copper sulfate pentahydrate, 50% ppm chloride ion and ±0.0% of an organic brightener sold under the tradename, Copperlume PTH-R from M&T Chemicals, Co. to provide a laminate having a copper thickness of about 35 um. The samples then were dried.

The microcracked samples then were tested for peel strength in an Instron Model 1000 Universal Testing Instrument to perform 90 degree peels using IPC test 2.4.9, Method A. The peel strength tests were constructed on ¼ inch copper strips which were formed by masking with a chemically resistant tape using a copper chloride etchent solution to remove metal from unmasked areas of the sample. The peel strengths (lb/in) were tested for each side initially and after 1, 2 or 3 cycles wherein the laminates were subjected to a temperature of 176° C. for 1 hour followed by room temperature for 3 minutes.

The results are shown in Table IV.

TABLE IV

|  | Side A | Side B |
|---|---|---|
| Initial | 8.3 | 9.2 |
| 1 Cycle | 6.6 | 6.8 |
| 2 Cycles | 6.7 | 6.1 |
| 3 Cycles | 6.4 | 6.3 |

As shown in Table IV, the laminate of this produced by the process of this invention had peel strength suitable to form electronic circuits.

EXAMPLE IV

Ten 4 inch by 6 inch prepunched sheets of Upilex 200S polyimide film were immersed for twenty seconds with no agitation at 80°±1° C. in the one-phase etchant solution comprising 35.5 wt. % KOH (45% w/w), 10.6 wt % ethylene-diamine, 10.6 wt. % ethylene glycol, the remainder water. The hydrophilized film was immersed for 60 seconds at 25° C. in a 23% solution of aqueous acid bath sold under the tradename, Shipley Cataprep 404 available from Shipley Corporation. The sheets then were immersed for 2 minutes at 45° C. in a 3% concentration of an aqueous colloidal palladium catalyst sold under the tradename, Shipley Cataposit 44 available from Shipley Corporation. The sheets then were rinsed for one minute in water and then immersed for 2 minutes at 25° C. in a 10% solution of an acetic acceleration sold under the tradename, Shipley Accelerator 19 available from Shipley Corporation. The sheets then were rinsed for 30 seconds in water and then immersed for 5 minutes at 65° C. in an electroless nickel plating solution, utilizing dimethylamine borane as the reducing agent, sold under the tradename Niklad 752 from the Allied Kelite division of Witco Chemical Corporation to a final nickel thickness of about 5 um on each surface.

Ten sheets of the nickel coated laminate then were treated to form microcracks in the nickel coatings by passing the sheets over a 0.078 inch outer diameter steel cylinder. The microcracked sheets then were baked at 176° C. ±1° to volatilize volatizable components from the polyimide.

The laminaters were immersed for 90 minutes at 15 amps per square food (ASF) in a brightened copper sulfate bath containing 25 ounces per gallon of sulfuric acid, 15 ounces per gallon of copper sulfate pentahydrate, 50% ppm chloride ion and ±0.0% of an organic brightener sold under the tradename, Copperlume PTH-R from M & T Chemicals, Co. to provide a laminate having a copper thickness of about 35 um. The samples then were dried.

The microcracked samples then were tested for peel strength in an Instron Model 1000 Universal Testing Instrument to perform 90 degree peels using IPC test 2.4.9, Method A. The peel strength tests were constructed on ¼ inch copper strips which were formed by masking with a chemically resistant tape using a copper chloride etchent solution to remove metal from unmasked areas of the sample. The peel strengths were tested for each side initially and after 1, 2 or 3 cycles wherein the laminates were subjected to a temperature of 176° C. for 1 hour followed by room temperature for 3 minutes.

The microcracked samples then were tested for peel strength in an Instron Model 1000 Universal Testing Instrument to perform 90 degree peels using IPC test 2.4.9, Method A. The peel strength tests were constructed on ¼ inch copper strips which were formed by masking with a chemically resistant tape using a copper chloride etchent solution to remove metal from unmasked areas of the sample.

The results are shown in Table IV.

The peel strengths were tested for each side initially and after 1 or 3 cycles wherein the laminates were subjected to a temperature of 176° C. for 1 hour followed by room temperature for 3 minutes.

TABLE IV

|  | Adhesion-Average sides A and B |
|---|---|
| Initial | 4.1 |
| 1 Cycle | 3.5 |
| 3 Cycles | 3.6 |

The laminates failed within the polyimide layer rather than at the metal-polyimide interface.

EXAMPLE IV

Twenty 4 inch by 6 inch prepunched sheets of 9121 Ultem polyimide film were immersed at 80°±1° C. for one minute with no agitation in the one-phase etchant solution comprising 35.5 wt. % KOH as (45% w/w), 10.6 wt % ethylenediamine, 10.6 wt. % ethylene glycol, the remainder water. The hydrophilized film was immersed for 60 seconds at 25° C. in a 23% solution of aqueous acid bath sold under the tradename, Shipley Cataprep 404 available from Shipley Corporation. The sheets then were immersed for 2 minutes at 45° C. in a 3% concentration of an aqueous colloidal palladium catalyst sold under the tradename, Shipley Cataposit 44 available from Shipley Corporation. The sheets then were rinsed for one minute in water and then immersed for 2 minutes at 25° C. in a 10% solution of an acetic acceleration sold under the tradename, Shipley Accelerator 19 available from Shipley Corporation. The sheets then were rinsed for 30 seconds in water and then immersed for 5 minutes at 65° C. in an electroless nickel plating solution, utilizing dimethylamine borane as the reducing agent, sold under the tradename Niklad 752 from the Allied Kelite division of Witco Chemical Corporation to a final nickel thickness of about 5 um on each surface.

Ten sheets of the nickel coated laminate then were treated to form microcracks in the nickel coatings by passing the sheets over a 0.078 inch outer diameter steel cylinder. The microcracked sheets then were baked at 176° C.±1 to volatilize volatizable components from the polyimide. Ten sheets were not microcracked.

The laminaters were immersed for 90 minutes at 15 amps per square food (ASF) in a brightened copper sulfate bath containing 25 ounces per gallon of sulfuric acid, 15 ounces per gallon of copper sulfate pentahydrate, 50% ppm chloride ion and ±0.0% of an organic brightener sold under the tradename, Copperlume PTH-R from M&T Chemicals, Co. to provide a laminate having a copper thickness of about 35 um. The samples then were dried.

Both the microcracked and non-microcracked samples then were tested for peel strength in an Instron Model 1000 Universal Testing Instrument to perform 90 degree peels using IPC test 2.4.9, Method A. The peel strength tests were constructed on ½ inch copper strips which were formed by masking with a chemically resistant tape using a copper chloride etchent solution to remove metal from unmasked areas of the sample. The peel strengths were tested for each side initially and after 1, 2 or 3 cycles wherein the laminates were subjected to a temperature of 176° C. for 1 hour followed by room temperature for 3 minutes.

The results are shown in Table V.

TABLE V

|  | Cracked and Baked | | Cracked and Baked | |
| --- | --- | --- | --- | --- |
|  | Side A | Side B | Side A | Side B |
| Initial | 3.0 | 2.8 | 2.5 | 3.2 |
| 1 Cycle | 2.5 | 2.3 | 0.5 | 0.5 |

The laminates failed within the polyimide layer rather than at the metal-polyimide interface.

EXAMPLE V

The procedure of Example III was utilized to laminate Upilex-S polyimide with the exception that through holes were formed in the polyimide during the etching step. The metal laminate was etched in patterns to remove the copper and nickel coatings on both sides of the laminate with a sodium persulfate etchant. The exposed polyimide surfaces were etched with the glycol-containing etchant for 10 minutes at 80°±1° C. in order to form through holes in the polyimide sheet. The etch rate was 0.2 mil/minute. The procedure was repeated with laminates formed from Ultem, 2 mil and Kapton 200 VN at an etch rate of 0.3 mil/minute and 1.6 mil/minutes respectively.

We claim:

1. A laminate product which comprises a polyetherimide sheet having at least one through-hole extending between two surfaces of said sheet, said surfaces of said sheet and the surfaces of said through-hole being uniformly and completely hydrophilized, said polyetherimide sheet surfaces and the surfaces of said at least one through-hole being free of an adhesive and having a metal coating comprising an electroless nickel or cobalt coating and an electrolytic copper coating bonded to each of said nickel or cobalt coatings, said laminate sheet product having a peel strength of at least 6.0 lb./in. as measured by IPC test 2.4.9 Method A and a peel strength of at least 4.5 lb./in. as measured by IPC test 2.4.13 for solder float.

2. The product of claim 1 wherein said electroless nickel or cobalt coating is a nickel containing alloy.

3. The product of any one of claims 1 or 3 wherein each of said metal coating on said polyetherimide sheet including copper is patterned.

* * * * *